US012730388B2

(12) United States Patent
De Haan et al.

(10) Patent No.: US 12,730,388 B2
(45) Date of Patent: Sep. 8, 2026

(54) METROLOGY METHOD AND APPARATUS

(71) Applicant: ASML Netherlands B.V., Veldhoven (NL)

(72) Inventors: Guido De Haan, Amsterdam (NL); Stephen Edward, Eindhoven (NL); Thomas Jan Van Den Hooven, Amsterdam (NL); Paulus Clemens Maria Planken, Jaarsveld (NL); Irwan Dani Setija, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 203 days.

(21) Appl. No.: 18/443,827

(22) Filed: Feb. 16, 2024

(65) Prior Publication Data

US 2024/0184222 A1 Jun. 6, 2024

Related U.S. Application Data

(63) Continuation of application No. PCT/EP2022/072017, filed on Aug. 4, 2022.

(30) Foreign Application Priority Data

Aug. 18, 2021 (EP) .................................... 21191859

(51) Int. Cl.
*G03F 9/00* (2006.01)

(52) U.S. Cl.
CPC .......... *G03F 9/7088* (2013.01); *G03F 9/7069* (2013.01); *G03F 9/7084* (2013.01)

(58) Field of Classification Search
CPC .... G03F 9/7053; G03F 9/7065; G03F 9/7069; G03F 9/7084; G03F 9/7088; G01N 21/554
See application file for complete search history.

(56) References Cited

U.S. PATENT DOCUMENTS 6,961,116 B2 11/2005 Den Boef et al.
2002/0006560 A1 1/2002 van der Schaar et al.
(Continued)

FOREIGN PATENT DOCUMENTS

CN 109061874 A 12/2018
WO WO 2009/078708 A1 6/2009
(Continued)

OTHER PUBLICATIONS

International Search Report issued in related International Application No. PCT/EP2022/072017, mailed Dec. 6, 2022 (3 pgs.).
Stephen Edward et al., "Detection of Hidden Gratings through Multilayer Nanostructures Using Light and Sound," Physical Review Applied 14, 014015 (2020), Published by the American Physical Society 2331-7019/20/14(1)/014015(16) (16 pgs.).
(Continued)

*Primary Examiner* — Peter B Kim
(74) *Attorney, Agent, or Firm* — Finnegan, Henderson, Farabow, Garrett & Dunner LLP

(57) ABSTRACT

Disclosed is a method for measuring a target located on a substrate beneath at least one layer. The method comprises exciting said at least one layer with pump radiation comprising at least one pump wavelength, so as to generate an acoustic wave within said at least one layer which reflects of said target thereby generating an acoustic replica of said target at a surface of said substrate and illuminating said acoustic replica with probe radiation comprising at least one probe wavelength and capturing the resultant scattered probe radiation, scattered from the acoustic replica. One or both of said exciting step and said illuminating step comprises generating Surface Plasmon Polaritons (SPPs) on residual topography of said at least one layer resultant from said target.

21 Claims, 6 Drawing Sheets

(56) References Cited

U.S. PATENT DOCUMENTS

| | | | |
|---|---|---|---|
| 2011/0027704 | A1 | 2/2011 | Cramer et al. |
| 2011/0043791 | A1 | 2/2011 | Smilde et al. |
| 2011/0102753 | A1 | 5/2011 | Van De Kerkhof et al. |
| 2012/0044470 | A1 | 2/2012 | Smilde et al. |
| 2012/0105853 | A1* | 5/2012 | Pang ........................ G03H 1/02 356/445 |
| 2012/0123581 | A1 | 5/2012 | Smilde et al. |
| 2013/0258310 | A1 | 10/2013 | Smilde et al. |
| 2013/0271740 | A1 | 10/2013 | Quintanilha |
| 2018/0073987 | A1* | 3/2018 | Chang-Hasnain ... G01N 21/648 |

FOREIGN PATENT DOCUMENTS

| | | | |
|---|---|---|---|
| WO | WO 2009/106279 | A1 | 9/2009 |
| WO | WO 2011/100070 | A1 | 8/2011 |
| WO | WO 2013/178422 | A1 | 12/2013 |
| WO | WO 2016/144908 | A1 | 9/2016 |
| WO | WO 2018/137925 | A1 | 8/2018 |
| WO | WO 2018/206177 | A1 | 11/2018 |
| WO | WO 2018/233951 | A1 | 12/2018 |
| WO | WO 2019/034318 | A1 | 2/2019 |

OTHER PUBLICATIONS

V. Verrina et al., "Photoacoustic detection of low duty cycle gratings through optically opaque layers," Applied Physics Letters 117, 051104 (2020) Research Article | Aug. 7, 2020 (6 pgs.).

S. Edward et al., "Detection of periodic structures through opaque metal layers by optical measurements of ultrafast electron dynamics," vol. 26, No. 18 | Sep. 3, 2018 | Optics Express 23380 © 2018 Optical Society of America under the terms of the OSA Open Access Publication Agreement (17 pgs.).

H. Ditlbacher et al., "Efficiency of local light-plasmon coupling," Applied Physics Letters, vol. 83, No. 18, Nov. 3, 2003 © 2003 American Institute of Physics (3 pgs.).

Gaëtan Lévêque et al., "Optimization of finite diffraction gratings for the excitation of surface plasmons," Journal of Applied Physics 100, 124301 (2006) © American Institute of Physics (6 pgs.).

Guido De Haan et al., "Plasmonic enhancement of photoacoustic-induced reflection changes," vol. 60, No. 24 / Aug. 20, 2021 / Applied Optics Research Article, 1559-128X/21/247304 Journal © Optical Society of America (10 pgs.).

* cited by examiner

METROLOGY METHOD AND APPARATUS

CROSS-REFERENCE TO RELATED APPLICATIONS

This application claims priority of International application PCT/EP2022/072017, filed on 4 Aug. 2022, which claims priority of EP application 21191859.4, filed on 18 Aug. 2021. These applications are incorporated herein by reference in their entireties.

FIELD

The embodiments of the present disclosure relate to methods and apparatus usable, for example, in the manufacture of devices by lithographic techniques, and to methods of manufacturing devices using lithographic techniques. The embodiments of the present disclosure relate more particularly to metrology sensors, such as position sensors.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as “fields”.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer.

In other applications, metrology sensors are used for measuring exposed structures on a substrate (either in resist and/or after etch). A fast and non-invasive form of specialized inspection tool is a scatterometer in which a beam of radiation is directed onto a target on the surface of the substrate and properties of the scattered or reflected beam are measured. Examples of known scatterometers include angle-resolved scatterometers of the type described in US2006033921A1 and US2010201963A1. In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

Deposition of opaque materials over the alignment mark can make the alignment mark invisible to the alignment sensor. This is particularly an issue with some 3D IC architectures, such as 3D-NAND, where thick layers of metal or amorphous carbon are used as hardmasks. Current solutions comprise aligning on the residual surface topography (the topography caused by the presence of an alignment mark below a layer) or by exposing clear-outs. Both of these approaches have limitations: aligning on residual surface topography lacks accuracy due to either asymmetric deformation or shift of the topography while exposing clear-outs requires additional process steps and is therefore slow.

It is desirable to improve alignment on alignment marks obscured by one or more opaque layers.

SUMMARY

The embodiments of the present disclosure provide a method for measuring a target located on a substrate beneath at least one layer, the method comprising: exciting said at least one layer with pump radiation comprising at least one pump wavelength, so as to generate an acoustic wave within said at least one layer which reflects of said target thereby generating an acoustic replica of said target at a surface of said substrate; illuminating said acoustic replica with probe radiation comprising at least one probe wavelength and capturing the resultant scattered probe radiation, scattered from the acoustic replica; wherein one or both of said exciting step and said illuminating step comprises generating Surface Plasmon Polaritons (SPPs) on residual topography of said at least one layer resultant from said target.

The embodiments of the present disclosure provide a metrology apparatus configured to perform the method of the first aspect.

The above and other aspects of the invention will be understood from a consideration of the examples described below.

BRIEF DESCRIPTION OF THE DRAWINGS

Embodiments will now be described, by way of example only, with reference to the accompanying drawings, in which.

DETAILED DESCRIPTION OF EMBODIMENTS

Before describing embodiments of the present disclosure in detail, it is instructive to present an example environment in which the embodiments of the present disclosure may be implemented.

Figure 1:
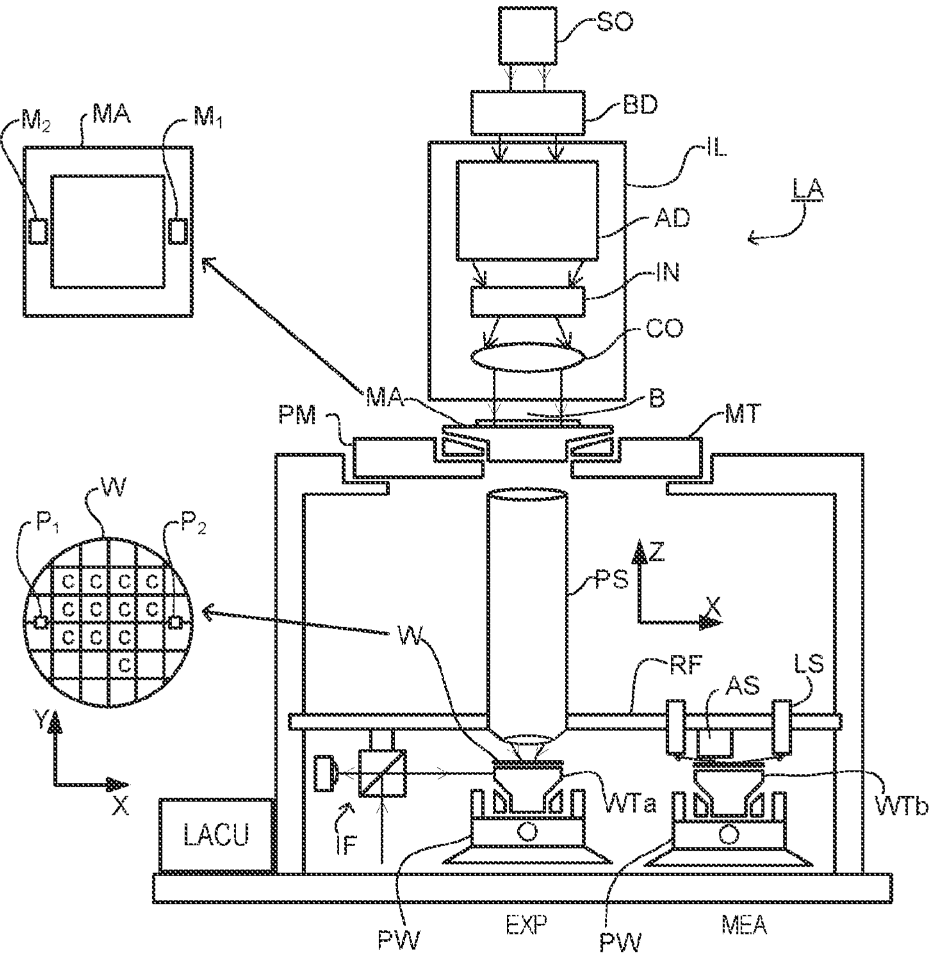
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components and serves as a reference for setting and measuring positions of the patterning device and substrate and of features on them.

The illumination system may include various types of optical components, such as refractive, reflective, magnetic, electromagnetic, electrostatic, or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic, and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder, or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the marks be as small as possible and not require any different imaging or process conditions than adjacent features. The alignment system, which detects the alignment marks is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment marks on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
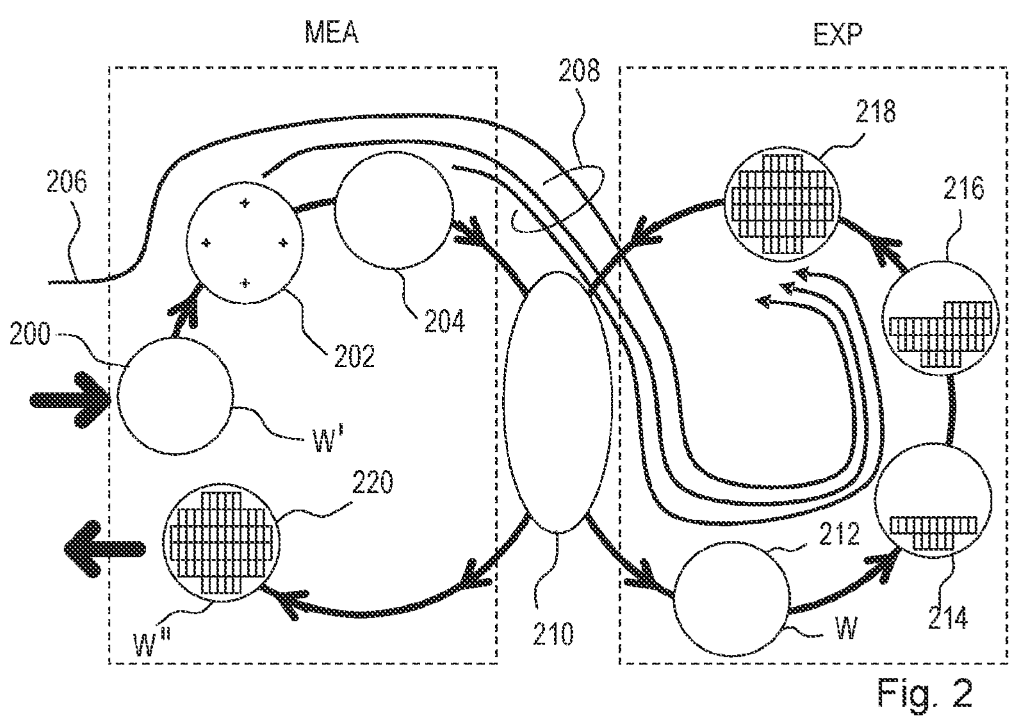
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one example to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation, and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W. W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

Figure 3:
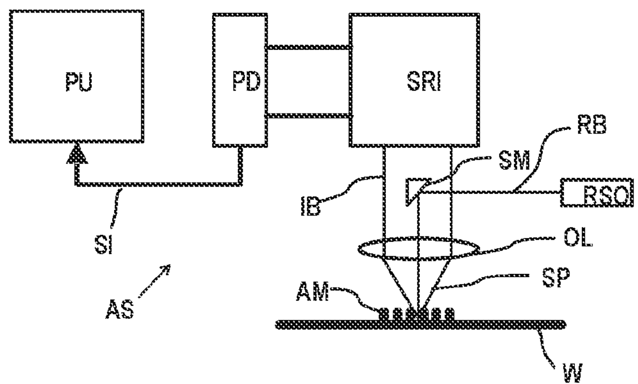
FIG. 3 depicts a schematic overview of an alignment sensor apparatus.

FIG. 3 is a schematic block diagram of an example of a known alignment sensor AS, such as is described, for example, in U.S. Pat. No. 6,961,116, and which is incorporated by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the alignment mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In some embodiments, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

There is a desire to measure alignment marks through optically opaque layers, as there is a lack of accuracy when aligning to residual topography due to either asymmetric deformation or shift of the topography. Exposing clear-outs is a viable but often very expensive solution due to additional process steps.

Photo-acoustic detection of buried marks has experimentally been demonstrated. Such photo-acoustic detection is described in WO2018137925A1, for example, which is incorporated herein by reference. Photo-acoustic alignment has the advantage that it relies on the same non-invasive optical detection methodology as existing alignment sensors. It only needs an additional pump pulse to excite the acoustic pulse in the opaque material. The acoustic reflection from the buried alignment mark is then detected by a probe pulse. However, in known photo-acoustic detection methods, the diffraction efficiency from the acoustic replica of the alignment mark is very weak, such that undesirably long averaging times are required to get a sufficient signal-tonoise ratio. This currently limits the application of such techniques to wafer alignment.

Figure 4:
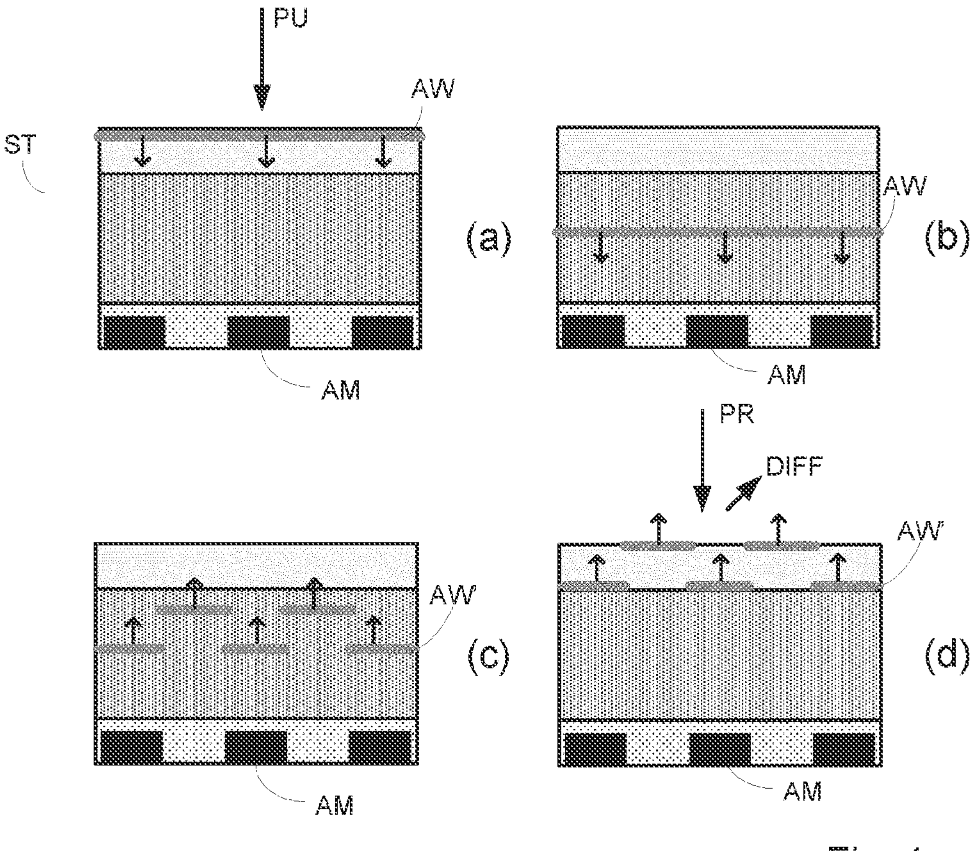
FIG. 4 is a schematic drawing of four stages of a pump-probe metrology method.

FIGS. 4(*a*) to 4(*d*) illustrates the concept of photo-acoustic metrology. FIG. 4(*a*) show the excitation of a surface of a multilayer stack ST with a strong pump pulse PU. This results in the generation of an acoustic wave AW in the top layer of the stack. This acoustic wave AW propagates through the optically opaque materials (FIG. 4(*b*)) and reflects off the buried alignment mark AM at the bottom of the multilayer stack ST. After reflecting, the acoustic wavefront AW' resembles the shape of the buried alignment mark. The reflected acoustic wave AW' propagates back to the surface (FIG. 4(*c*)), where it physically deforms the surface and, simultaneously, modifies the optical properties of the material near the surface. As the wavefront of the acoustic wave resembles the spatially periodic shape of the alignment mark AM, the deformation of the surface and the modification of the permittivity also follow the same spatial periodicity and position of the alignment mark. After a programmed time delay, a probe pulse PR (FIG. 4(*d*)) is used to detect the echo-induced image (the acoustic replica) of the buried alignment mark. By spatially scanning across the wafer and performing pump-probe measurements, as described above, it is possible to determine the presence of a buried alignment mark by measuring the pump-induced diffraction DIFF off the surface.

Due to surface roughness, some of the probe light PR will always diffract (scatter) into the direction of the detector. To address this, a difference of the measured diffraction from two probe pulses may be taken: a pre-pump pulse and a post-pump pulse. This enables measurement of the change in diffraction resulting from the pump pulse. However, the magnitude of this diffraction change is too small to be used for alignment metrology in high volume manufacturing.

To address this issue and increase the signal strength it is proposed to use a Surface Plasmon Polariton (SPP) resonance to increase the absorption of the pump radiation and/or increase the diffraction efficiency induced by the acoustic reflection (grating replica at surface) for the probe measurement.

An SPP is the coupling of the electro-magnetic light field with coherent oscillations of the conduction electrons at the interface between a metal or a metal-like material (e.g., a material with high carrier density/high conductivity such as a metal or other conductive material such as amorphous carbon), and a dielectric. An SPP is an electromagnetic wave bound to the interface between the dielectric and conductive medium. Launching an SPP is a resonant process, and as such, certain conditions have to be fulfilled such as conservation of momentum. An SPP can be described as a surface optical wave with a wavevector ($k_{SPP}$) that is larger than the wavevector of the incident light ($k_x$) having the same optical frequency in air or vacuum. This so-called wavevector mismatch can be overcome by a number of different methods. One method is to use a periodic sub-segmentation within the grating unit cell, which can be seen as having a fixed wavevector $k_{sub}$ on its own and which can be added or subtracted from the incident optical wavevector to facilitate excitation of the SPP. Launching an SPP results in an increase in absorption of the material (i.e., a reduction in reflectivity of the conductive material at its surface).

In order to exploit the SPP to enhance the acoustic diffraction efficiency, it is proposed to use dedicated alignment marks comprising a sub-segmentation of first portions (e.g., in contrast to non-sub-segmented second portions) of the marks that is resonant with an SPP under a certain angle-of-incidence. It has been shown that it is possible to excite SPPs efficiently on gratings with only a few (less than 5) grating lines. The sub-segmentation of these alignment marks will be mirrored in the residual topography of the top layer; it is on this residual topography of the sub-segmented sections that SPPs will be generated.

Figure 5:
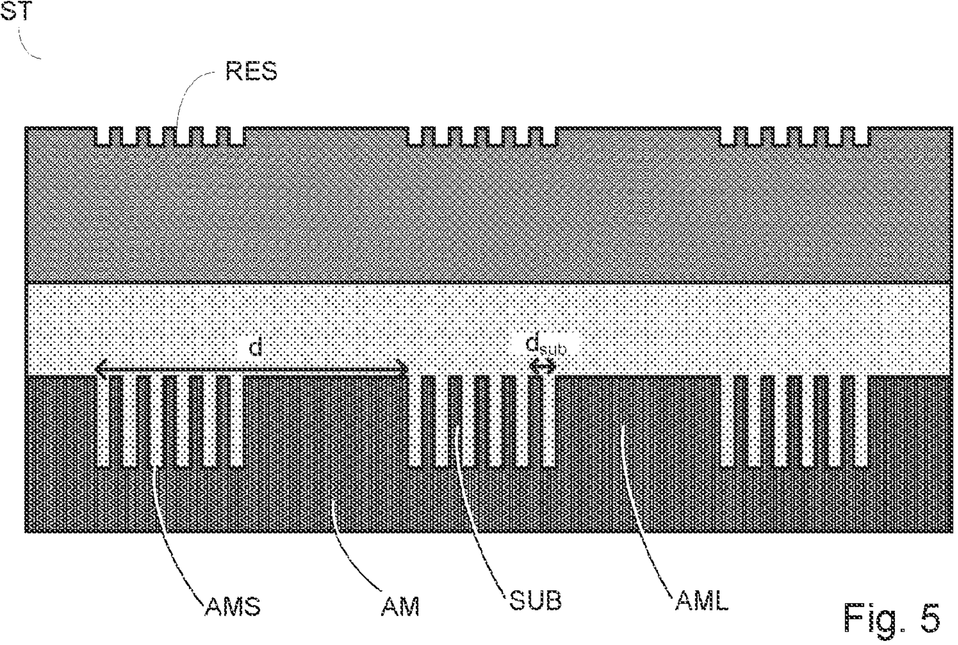
FIG. 5 is an example of an example structure of a buried alignment mark which may be measured using methods consistent with embodiments of the present disclosure.

FIG. 5 is a schematic drawing of part of such an alignment mark AM comprised within a stack ST. The alignment mark AM comprises a buried grating (i.e., comprising periodic repetition of a line AML and space AMS). The alignment mark AM comprises a sufficiently large period d such that either the grating lines or the grating spaces can be sub-segmented SUB with a shorter period $d_{sub}$. In this specific example, it is the alignment mark spaces AMS which are sub-segmented, although it could equally be the alignment mark lines AML which are sub-segmented to achieve the same effect.

In order to fulfill the condition of momentum conservation ($|k_x \pm k_{sub}| = |k_{SPP}|$) and generate an SPP, a number of measurement parameters need to be tuned. The most relevant parameters are:

- the wavevector of the incident light $k_x$, which in turn is determined by the incident optical frequency ω (i.e., incident wavelength) and the angle of incidence $\theta_{in}$:

$$k_x = \mathrm{Sin}(\theta_{in}) * \frac{\omega}{c}$$

(where c is the speed of light).
- the wavevector resultant from the sub-segmentation $k_{sub}$, which is determined by the period of the sub-segmentation $d_{sub}$.
- the wavevector of the SPP $k_{SPP}$, which is determined by the incident optical frequency and the dielectric functions of the conductor 〚(ϵ〛$_m$) and dielectric ($\epsilon_d$):

$$k_{spp} = \frac{\omega}{c}\sqrt{\frac{\epsilon_m \epsilon_d}{\epsilon_m + \epsilon_d}}$$

In some embodiments, the residual topography RES from this sub-segmentation enables SPPs to be generated from the pump radiation. These pump generated SPPs increase absorption of the pump radiation such that the acoustic replica of the alignment mark at the surface will be stronger (larger in amplitude), which improves the signal strength when the acoustic replica is measured by the probe pulse.

In some embodiments, the probe radiation is configured to generate SPPs on the residual topography. It does this by altering the absorption/reflection at the stack surface corresponding to (i.e., directly above) the sub-segmented portions of the alignment mark (which may be the lines or the spaces). In this way, the sub-segmentation enables enhancement of the optical detection of the acoustic replicas of the buried alignment gratings, due to the fact that SPP resonance parameters are sensitive to changes in grating amplitude, duty-cycle, shape and permittivity induced acoustically by the reflected acoustic replicas. Due to the SPPs, the acoustically induced changes in reflection corresponding to the sub-segmented portions of the alignment mark differ from acoustically induced changes corresponding to the non-sub-segmented portions which improves the diffraction efficiency of the alignment mark acoustic replica at the surface.

Both of these embodiments may be implemented in isolation to achieve improved measurement signal strength with respect to prior art methods. However, greater improvement will be achieved if the two embodiments are implemented together such that both the pump and probe radiation are each configured to generate SPPs on the residual topography.

Figure 6:
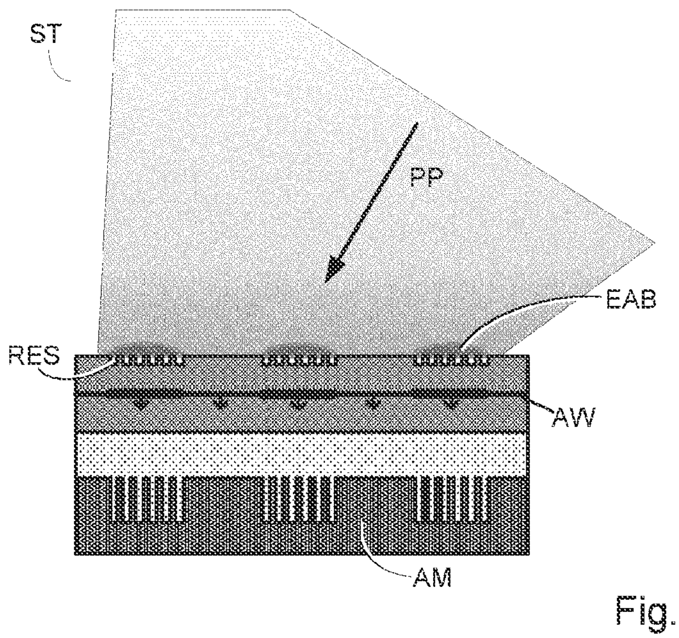
FIG. 6 is a schematic drawing of a pump pulse incident on an alignment mark such as illustrated in FIG. 5, performed according to methods consistent with embodiments of the present disclosure.

FIG. 6 is a schematic diagram illustrating the improved absorption of the pump pulse due to pumping on the SPP resonance (i.e., the pump radiation is configured to meet the SPP resonance conditions). A pump pulse beam PP has a wavelength and incident angle such that SPPs are excited on the sub-wavelength segmented grating lines of the residual topography RES of the alignment mark. These SPPs result in regions of enhanced absorption EAB on the residual topography RES, such that pump light is more efficiently absorbed into the stack at these regions EAB. This gives rise to higher amplitude acoustic waves AW, particularly below the regions of enhanced absorption EAB, than would be obtained without the use of sub-wavelength segmented grating lines. These higher amplitude acoustic waves will reflect off the buried alignment mark AM to generate an acoustic replica which travels back to the surface. This acoustic replica has a higher amplitude than if no SPPs were generated by the pump radiation, and therefore the probe measurement of this acoustic replica will generate a stronger signal.

Figure 7:
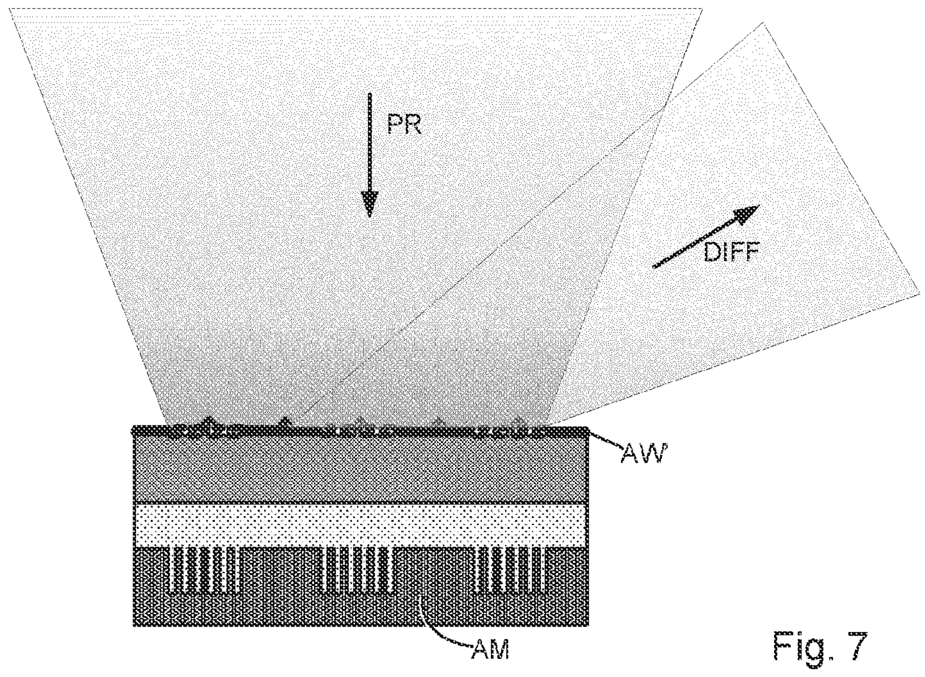
FIG. 7 is a schematic drawing of a probe pulse incident on an alignment mark such as illustrated in FIG. 5, performed according to methods consistent with embodiments of the present disclosure.

FIG. 7 is a schematic diagram illustrating the improved diffraction efficiency by tuning the probe pulse to the SPP resonance frequency. A probe pulse PR diffracts off the reflected acoustic wave AW'. However, the probe pulse is also tuned (e.g., via angle of incidence and/or sub-segmentation pitch) to the SPP resonance frequency. SPPs display a fairly narrow absorption/reflection resonance as a function of wavelength for a given angle of incidence. As such, changes in amplitude and/or duty-cycle of the subwavelength pitch sub-segmentation causes changes in width, strength, and wavelength of the SPP resonance. These changes can occur due to material density changes induced by the acoustic echoes returning from the buried grating. The portions of the alignment mark which are sub-segmented with a plasmonic-grating form a residual topography (partially obscured by the reflected acoustic wave AW' in the drawing) onto which the probe will couple to generate SPPs. By optically probing at, or around the SPP resonance, the reflection of the probe pulse becomes significantly more sensitive to these changes compared to the case of an unstructured surface.

In the absence of an acoustic wave, the presence of an SPP at the surface would reduce the reflection of an incoming probe beam which is on/near resonance according to the principles described in the previous example. However, the pump-generated acoustic wave compresses and contracts the grating lines of the sub-segmented plasmonic grating, changing the amplitude/shape of the grating lines of the sub-segmented grating. This results in a shift of the SPP resonance conditions, which will change the amount of light which is reflected from the acoustic replica of the sub-segmented grating. This shift of the SPP resonance can either increase or decrease the amount of reflection, depending on whether the acoustic wave expands or contracts the sub-segmented grating portions (lines or spaces). This change, however, only happens at surface regions immediately above the sub-segmentation.

As such, while an SPP resonance in general decreases the reflection, in the presence of an acoustic wave the reflectivity of the sub-segmented grating portions with respect to the already SPP induced decreased reflection, can increase or decrease depending on whether the acoustic wave is expanding or contracting the grating.

Therefore, the acoustic wave alters the properties of both the lines and spaces of the alignment mark AM on return to the surface. However, the acoustic-wave-induced reflection changes of the sub-segmented portions (e.g., the spaces in the FIG. 7 example) with respect to the non-sub-segmented portions (e.g., the lines in the FIG. 7 example) will be larger. This difference in reflectivity change of the sub-segmented portions with respect to the non-sub-segmented portions (e.g., spaces with respect to the lines) leads to an increased diffraction efficiency of the alignment mark (or more specifically of the acoustic replica). As such, this increase in diffraction efficiency arises from the fact that the lines and spaces experience a different acoustic-wave-induced change in reflection.

Figure 8:
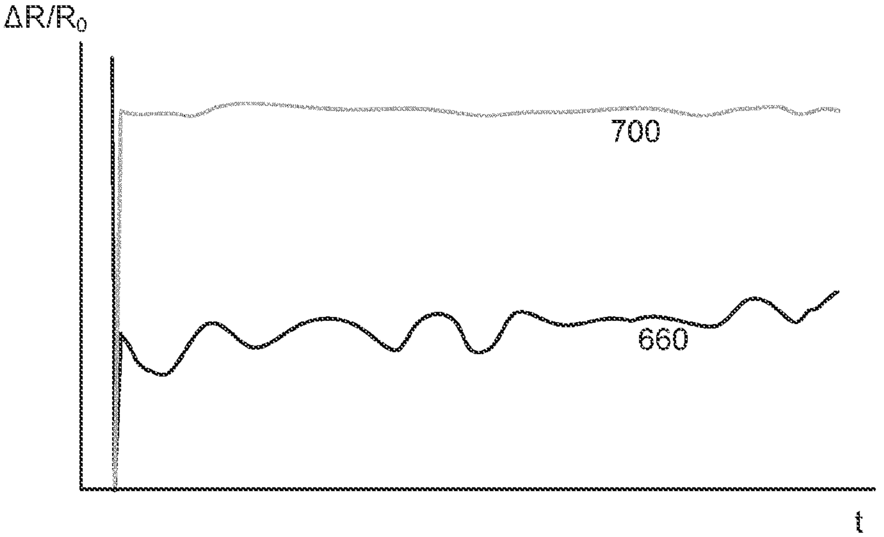
FIG. 8 is a reflectivity plot from an acoustic replica using probe radiation such that no SPPs are generated and such that SPPs are generated, consistent with embodiments of the present disclosure.

FIG. 8 is a graph of the pump induced reflectivity change $\Delta R/R_0$ against the time interval t between pump and probe pulses. Two plots are shown, a first plot 700 where the probe wavelength is 700 nm and a second plot 660 where the probe wavelength is 660 nm. The configuration is such that the SPP resonance wavelength is located at 650 nm. For each plot, the pump pulse was identical; however the sensitivity to the acoustic waves is much stronger when measured with a probe wavelength at or near the SPP resonance. In the example, the probing wavelength is 660 nm rather than 650 nm to illustrate that the probing signals are also enhanced close to, but not exactly on, the SPP resonance. The situation is a bit more complicated in that the resonance has a finite width, whereas the optical signal changes induced by some types of acoustic waves show their strongest enhancements exactly on the SPP resonance while others are enhanced only on the slopes of the resonance. However, in the context of this disclosure, the probe radiation having a wavelength at or near the SPP resonance wavelength may describe the probe radiation wavelength being within 40 nm, within 30 nm, within 20 nm, within 15 nm or within 10 nm of the SPP resonance wavelength.

A further benefit of generating SPPs by the pump radiation or probe radiation to increase absorption in this way is that it provides greater flexibility in selection of the absorption frequency (i.e., the SPP resonance frequency). This absorption frequency is fixed when a resonance of the bulk material (e.g. interband resonances) is used. The residual topography of the sub-segmented grating lines enables excitation of SPPs, which increases absorption in a wavelength range where the material would otherwise show significantly less absorption. As such, by using pump radiation and/or probe radiation close to this absorption frequency, the diffraction efficiency can be increased. The central wavelength/absorption frequency of the SPP depends on the sub-segmentation period, the angle of incidence and the incident wavelength; as such the former two of these parameters can be tuned to provide additional flexibility in choosing a convenient wavelength range for the pump radiation and/or probe radiation, e.g., a range for which suitable light sources are available. If the wavelength is fixed (e.g., a particular source is to be used), the SPP resonance frequency can be adjusted by changing the incident angle and/or sub-segmentation period. An angle of incidence of zero degrees (perpendicular incidence) is also possible, which means that the SPP resonance wavelength can only be adjusted by choosing the appropriate sub-segmentation period (or incident wavelength).

The various embodiments described above may be combined to enhance the acoustic wave amplitude and to enhance the optical sensitivity to the presence of acoustic waves reflected off the buried grating.

Figure 9:
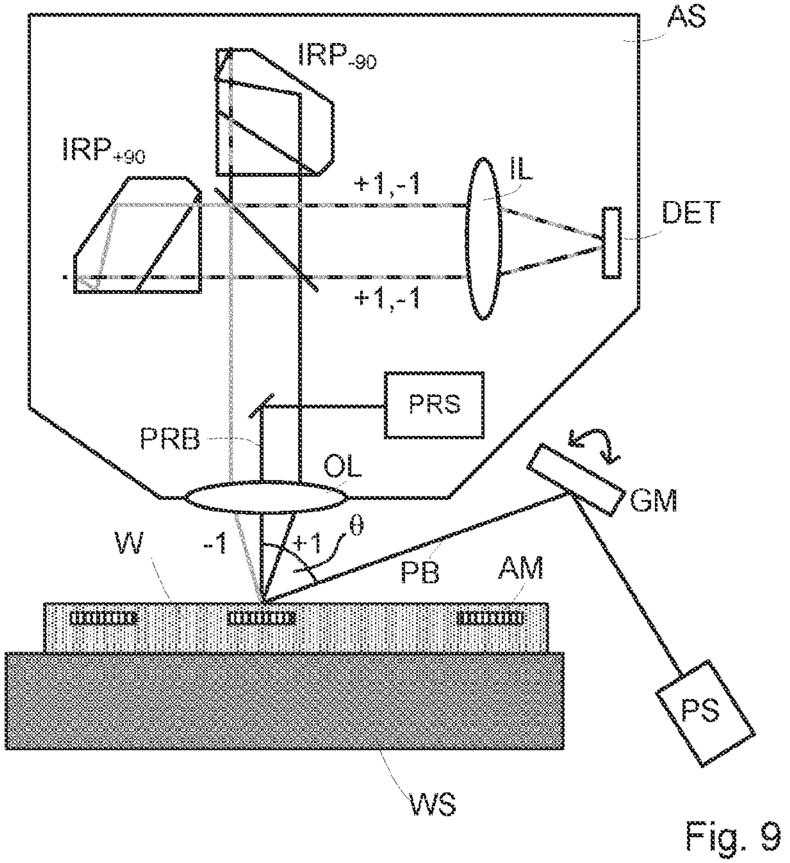
FIG. 9 is a metrology apparatus arrangement suitable for performing methods consistent with embodiments of the present disclosure.

FIG. 9 is a schematic illustration of an alignment arrangement suitable for implementing such a combined example. The pump radiation may be generated by a pump radiation source PS outputting a pump beam PB to the (e.g., buried) alignment mark AM via a suitable beam delivery arrangement represented here by a guided mirror GM. An alignment sensor AS is used to deliver the probe pulse. The alignment sensor AS may be a standard alignment sensor, and is shown here comprising a probe source PRS (which may in reality be outside of the alignment sensor AS) which outputs a probe beam PB, objective lens OL, illumination lens IL, detector DET (which again may be comprised outside of the alignment sensor), and two image rotation prisms $IRP_{+90}$, $IRP_{-90}$ which rotate the diffracted orders through +90 degrees and −90 degrees respectively. The basic operation of such an alignment sensor is well known and has been briefly described above, and as such will not be described further.

The pump radiation and the probe radiation comprise different wavelengths which, in combination with their respective angles of incidence (the pump radiation beam PB having an angle of incidence θ and the probe beam PRB having a normal incidence in this illustrative example), are each configured to excite SPPs. Both the effects described for the two embodiments will increase the diffraction efficiency of the acoustic replica of the buried alignment grating when measured by the probe pulse.

It can be shown, for example, that the absorption on resonance for a 5 nm residual topography with respect to the absorption off resonance increases by a factor of 3. Thus the acoustic wave amplitude also increases by a factor of 3, resulting in an increase in diffraction efficiency of the acoustic replica by a factor of $3^2=9$. Additionally, acoustic waves can change the amplitude and duty cycle of the sub-segmentation in addition to the frequency-dependent permittivity. In turn, this changes the shape (depth, width) and wavelength of the SPP resonance which immediately increases or decreases the reflection coefficient at and around the SPP resonance wavelength. For large amplitude gratings (>15 nm), SPP resonance shifts dominate the reflection changes but for low amplitude gratings, changes in the depth of the SPP resonance dominate. It can be shown that, a 200 picometer change in the sub-wavelength segmented grating amplitude caused by the acoustic wave would thus lead to a 0.5% change in reflection, which is significantly more than values seen without SPP resonance. This results in an increase in reflection on the grating spaces of 0.5% whilst the reflection of the grating lines remains unchanged (or vice versa). Such a difference in reflection between the grating lines and spaces may lead to an acoustically induced diffraction efficiency of approximately $4*10^{-4}$, i.e., six orders of magnitude greater than pulse-probe measurements without generating SPPs.

Figure 10:
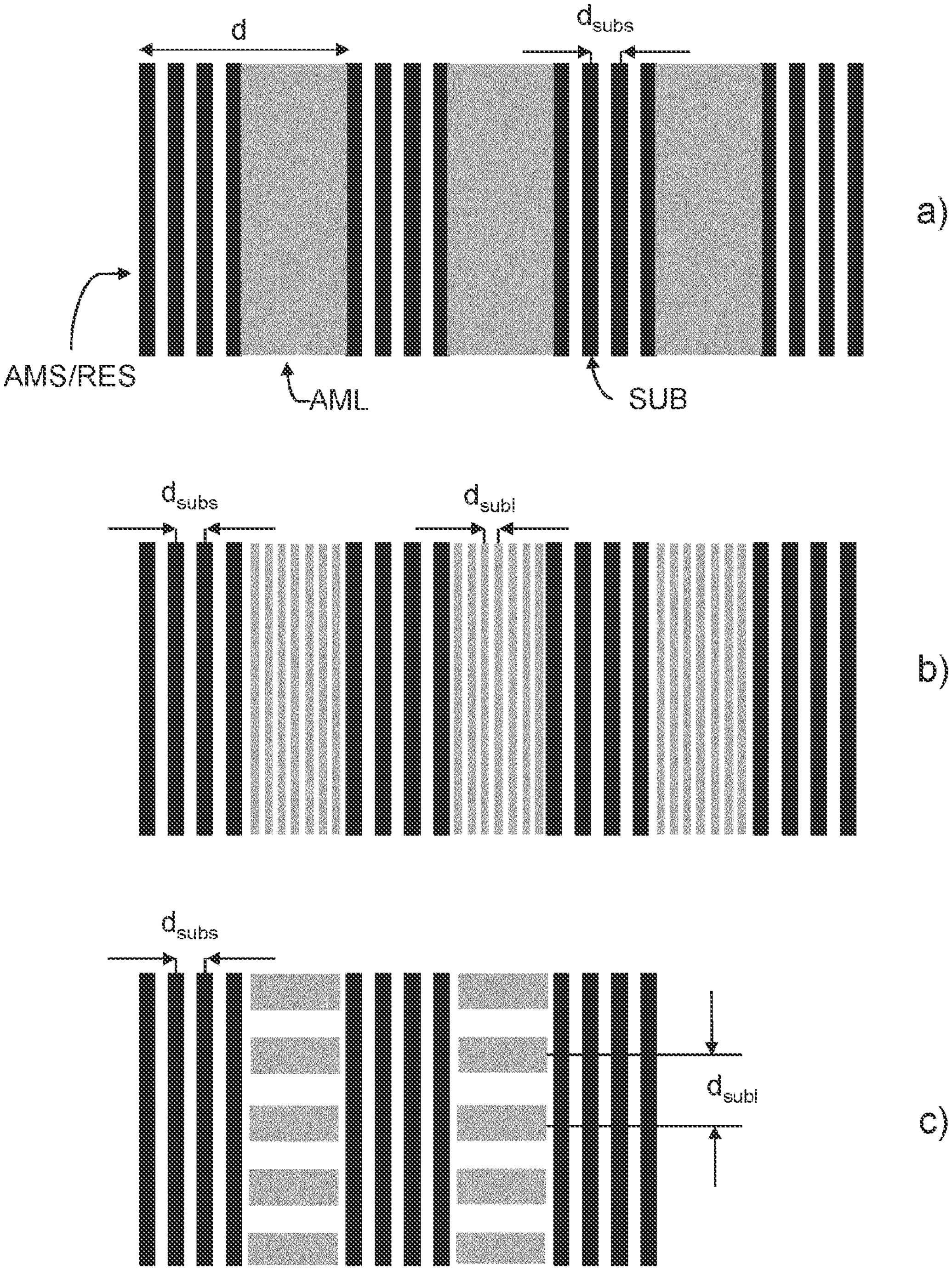
FIG. 10 is a schematic drawing of examples of top views of the structures of a buried alignment marks which may be measured using methods consistent with embodiments of the present disclosure.

FIG. 10 is a schematic representation of the alignment mark AM comprised within the stack ST. The alignment mark AM represented in FIG. 5 in cross section is depicted in FIG. 10(*a*) as top view, wherein the alignment mark lines AML do not contain any sub-segmentation and wherein the alignment mark space AMS contain periodic sub-segmentation, sub-segmentation visible on the surface as residual topography RES. The alignment mark has therefore a first portion comprising periodic sub-segmentation, within the alignment mark space AMS. A further example is depicted in FIGS. 10(*b*) and FIG. 10(*c*) comprising a first portion comprising periodic sub-segmentation and a second portion comprising sub-segmentation. In the examples in FIG. 10(*b*) the periodic sub-segmentation of the second portions has a pitch of $d_{subl}$ and the periodic sub-segmentation of the first portion has a pitch of $d_{subs}$. In other words, the alignment mark space AMS has a periodic sub-segmentation with a pitch $d_{subs}$ and the alignment mark line AML has a periodic sub-segmentation with a pitch $d_{subl}$. As exemplified in FIG. 10(*b*) and FIG. 10(*c*), the direction of the pitch of the alignment mark line AML may be parallel with the pitch of the alignment mark space AMS as shown in FIG. 10(*b*) or the direction of the pitch of the alignment mark line AML may be orthogonal to the pitch of the alignment mark space AMS. As described above, in particular in the description of the operation of the target when illuminated with probe pulse PR or pump pulse PP as illustrated in FIGS. 5, 6 and 7, the periodic sub-segmentation in the second portion of the target creates an enhanced absorption EAB, thus, for the target arrangements of FIGS. 10(*b*) and (*c*), there are two enhanced absorption EAB regions. In some embodiments, the first portion of the target comprising periodic sub-segmentation with a pitch $d_{subs}$, corresponding to the alignment mark space, is suitable to create an SPP when illuminated with the pump pulse PP whereas the second portion of the target comprising periodic sub-segmentation with a pitch $d_{subl}$, corresponding to the alignment mark line, is suitable to create an SPP when illuminated with the probe pulse PR. With the target arrangements of FIGS. 10(*b*) and (*c*) is therefore possible to measure, on the same target arrangement, the location of the alignment mark utilizing the enhanced absorption of both the pump pulse PP and the probe pulse PR. Each one of the first and second portions are designed for one of the available illumination conditions, pump pulse PP or probe pulse PR. In some embodiments, the alignment mark space may comprise a third portion, such that, when the alignment mark space AMS is designed to be used together with the probe pulse PR, a second wavelength of the probe pulse PR may be used.

It may be noted that the composition of the metal (or more generally, conductive) surface can also be chosen such that SPPs are excited in a particular wavelength range. For example, materials with high carrier density (high conductivity) may be excited using visible radiation while materials with lower carrier density (e.g., amorphous carbon) may be excited using IR radiation.

As with prior art methods, an alignment measurement according to the concepts described herein may comprise a difference value between a post-pump probe measurement and a pre-pump probe measurement.

The description above has been described entirely in the context of alignment metrology. However, the concepts described herein can be used to measure buried targets for any other metrology purpose (e.g., overlay metrology, focus metrology). Therefore the disclosure is not limited to alignment metrology nor measurement of alignment marks, but any suitable metrology type and measurement of any suitable type of metrology target.

While specific embodiments of the invention have been described above, it will be appreciated that the invention may be practiced otherwise than as described.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure, or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic, and electrostatic optical components. Reflective components are likely to be used in an apparatus operating in the UV and/or EUV ranges.

The breadth and scope of the present invention should not be limited by any of the above-described exemplary embodiments but should be defined only in accordance with the following claims and their equivalents.

The invention claimed is:

1. A method for measuring a target located on a substrate beneath at least one layer, the method comprising:

exciting said at least one layer with pump radiation comprising at least one pump wavelength, so as to generate an acoustic wave within said at least one layer which reflects of said target thereby generating an acoustic replica of said target at a surface of said substrate; and illuminating said acoustic replica with probe radiation comprising at least one probe wavelength and capturing resultant scattered probe radiation, scattered from the acoustic replica;

wherein one or both of said exciting and said illuminating comprises generating Surface Plasmon Polaritons (SPPs) on residual topography of said at least one layer resultant from said target.

2. The method of claim 1, wherein said target comprises a periodic structure, said periodic structure comprising a periodic sub-segmentation of first portions of said periodic structure.

3. The method of claim 2, wherein said periodic structure comprises repetitions of a line and a space and said first portions comprising a periodic sub-segmentation comprise either said lines or said spaces.

4. The method of claim 1, wherein an angle of incidence of said pump radiation and said pump wavelength are such that said SPPs are generated by said pump radiation on said residual topography.

5. The method of claim 4, wherein said SPPs increase absorption of at least some of said pump radiation into said at least one layer.

6. The method of claim 1, wherein an angle of incidence of said probe radiation and said probe wavelength are such that said SPPs are generated by said probe radiation on said residual topography.

7. The method of claim 6, wherein said SPPs alter reflectivity characteristics of said at least one layer corresponding to first portions of said target with respect to reflectivity characteristics of said at least one layer corresponding to second portions of said target.

8. The method of claim 1, wherein an angle of incidence of said probe radiation is different to an angle of incidence of said pump radiation.

9. The method of claim 1, wherein said pump wavelength is different to said probe wavelength.

10. The method of claim 1, wherein said pump wavelength and/or said probe wavelength is within 30 nm of a resonance wavelength for generation of said SPPs.

11. The method of claim 1, wherein said pump wavelength and/or said probe wavelength is within 15 nm of a resonance wavelength for generation of said SPPs.

12. The method of claim 1, further comprising configuring an angle of incidence of said probe radiation and/or a geometry of said target to adjust a resonance wavelength for generation of said SPPs.

13. The method of claim 1, wherein said target comprises an alignment mark and said exciting and illuminating form part of an alignment measurement.

14. The method of claim 1, further comprising:

performing an initial illuminating to illuminate said at least one layer above said target prior to said exciting said at least one layer and capturing the resultant scattered probe radiation, scattered from said at least one layer above said target; and the method further comprises:

determining a difference value for a parameter of interest as a difference of a first parameter of interest value obtained from said illuminating said acoustic replica performed subsequent to said excitation said at least one layer and a second parameter of interest value obtained from said initial illuminating.

15. The method of claim 1, wherein said at least one layer is opaque to said pump radiation and/or probe radiation.

16. A metrology device operable to perform the method of claim 1.

17. The metrology device of claim 16, further comprising a pump source for generating said pump radiation and a probe source for generating said probe radiation.

18. The metrology device of claim 16, wherein said metrology device is an alignment sensor.

19. A lithographic apparatus comprising the alignment sensor of claim 18.

20. A target for use in claim 1 wherein the target comprises a periodic structure, said periodic structure comprising at least a first portion having a periodic sub-segmentation.

21. A target according to claim 20 wherein the periodic structure of the target comprises a second portion having a periodic sub-segmentation.

* * * * *